US012807375B2

(12) United States Patent
Mori

(10) Patent No.: US 12,807,375 B2
(45) Date of Patent: Nov. 24, 2026

(54) STORAGE CONTAINER, PROCESSING APPARATUS, BONDING APPARATUS, PROCESSING METHOD, AND BONDING METHOD

(71) Applicant: CANON KABUSHIKI KAISHA, Tokyo (JP)

(72) Inventor: Kenichiro Mori, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 349 days.

(21) Appl. No.: 18/532,064

(22) Filed: Dec. 7, 2023

(65) Prior Publication Data

US 2024/0213211 A1 Jun. 27, 2024

(30) Foreign Application Priority Data

Dec. 21, 2022 (JP) ................................ 2022-204637

(51) Int. Cl.

| | |
|---|---|
| ***B65D 25/10*** | (2006.01) |
| ***B65D 43/02*** | (2006.01) |
| ***B65D 55/02*** | (2006.01) |
| *H10W 80/00* | (2026.01) |

(52) U.S. Cl.

CPC ......... *B65D 43/0202* (2013.01); *B65D 25/10* (2013.01); *B65D 55/02* (2013.01); *B65D 2251/0018* (2013.01); *B65D 2251/0081* (2013.01); *H10W 80/011* (2026.01); *H10W 80/312* (2026.01); *H10W 80/327* (2026.01)

(58) Field of Classification Search

CPC .... B65D 25/10; B65D 43/0202; B65D 55/02; H01L 24/80

See application file for complete search history.

(56) References Cited

U.S. PATENT DOCUMENTS

| | | | | |
|---|---|---|---|---|
| 9,064,917 B2 * | 6/2015 | Ku | ...................... | H10P 72/1914 |
| 10,351,311 B2 * | 7/2019 | Liu | ........................ | B65D 85/36 |
| 10,759,588 B1 * | 9/2020 | Lobisser | ................ | B65D 19/02 |
| 10,919,280 B2 * | 2/2021 | Hemnani | .............. | B32B 37/025 |
| 11,231,203 B1 * | 1/2022 | Des Champs | ............ | F16T 1/20 |

(Continued)

FOREIGN PATENT DOCUMENTS

| | | |
|---|---|---|
| JP | H06255691 A | 9/1994 |
| JP | H06302575 A | 10/1994 |

(Continued)

OTHER PUBLICATIONS

Office Action issued in Taiwanese Appln. No. 112148028 dated Aug. 27, 2026.

*Primary Examiner* — Dale E Page
*Assistant Examiner* — Wilner Jean Baptiste
(74) *Attorney, Agent, or Firm* — ROSSI, KIMMS & McDOWELL LLP

(57) ABSTRACT

A storage container for storing a die includes a main body including a first through hole and a second through hole, a first lid that is attachable to the main body to cover the first through hole, and a second lid that is attachable to the main body to cover the second through hole. The die is removed/inserted from/into the main body via the first through hole, and the second through hole is configured to process the die via the second through hole.

19 Claims, 15 Drawing Sheets

(56) References Cited

U.S. PATENT DOCUMENTS

| | | | | |
|---|---|---|---|---|
| 2003/0219323 | A1* | 11/2003 | Shoup | B65D 19/06 410/31 |
| 2008/0029879 | A1 | 2/2008 | Tuckerman et al. | |
| 2017/0278787 | A1 | 9/2017 | Uzoh et al. | |

FOREIGN PATENT DOCUMENTS

| | | | |
|---|---|---|---|
| JP | H07176511 | A | 7/1995 |
| JP | 2001298080 | A | 10/2001 |
| JP | 2012012042 | A | 1/2012 |
| JP | 2016162985 | A | 9/2016 |

* cited by examiner

STORAGE CONTAINER, PROCESSING APPARATUS, BONDING APPARATUS, PROCESSING METHOD, AND BONDING METHOD

BACKGROUND OF THE INVENTION

Field of the Invention

The present invention relates to a storage container, a processing apparatus, a bonding apparatus, a processing method, and a bonding method.

Description of the Related Art

There is a bonding method of bonding a die to a bonding target after the target bonding surface of the die is processed. Japanese Patent Laid-Open No. 6-255691 discloses a semiconductor chip storage case including a storage unit configured to store a semiconductor chip, and a storage lid configured to cover the storage unit. The bottom surface of the storage unit is tapered, one end of a suction hole is connected to the bottom surface of the storage unit, and an opening/closing valve is provided at the other end of the suction hole.

Consider a case where the semiconductor storage case described in Japanese Patent Laid-Open No. 6-255691 is applied to a bonding method. Normally, in a case where the upper surface of the semiconductor chip stored in the semiconductor storage case is processed, and then, the upper surface is bonded as a target bonding surface to a bonding target, a mechanism for operating the semiconductor chip contacts the target bonding surface after the process of the target bonding surface. Also, when bonding the lower surface of the semiconductor chip stored in the semiconductor storage case as the target bonding surface to the bonding target, the target bonding surface cannot be processed in a state in which the semiconductor chip is stored in the semiconductor storage case.

SUMMARY OF THE INVENTION

The present invention provides a technique advantageous in processing a target bonding surface and bonding the target bonding surface to a bonding target without making a member contact the processed target bonding surface.

One of aspects of the present invention provides a storage container for storing a die, comprising: a main body including a first through hole and a second through hole; a first lid that is attachable to the main body to cover the first through hole; and a second lid that is attachable to the main body to cover the second through hole, wherein the die is removed/inserted from/into the main body via the first through hole, and the second through hole is configured to process the die via the second through hole.

Further features of the present invention will become apparent from the following description of exemplary embodiments with reference to the attached drawings.

DESCRIPTION OF THE EMBODIMENTS

Figure 1:
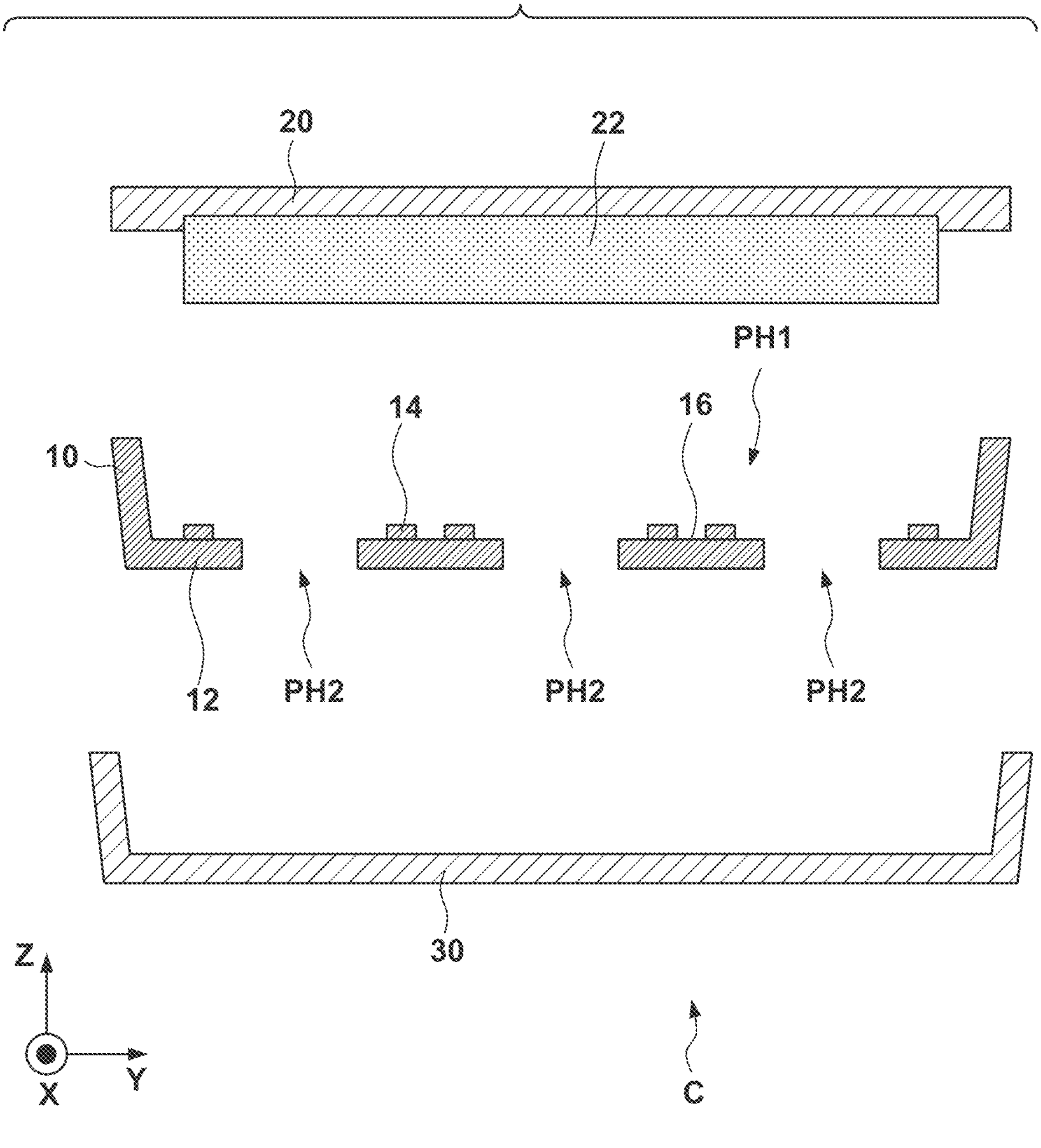
FIG. 1 is a sectional view of a storage container according to the first embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

A storage container according to the present disclosure can be used in a bonding method for, for example, bonding a die to one or a plurality of locations of a bonding target. The bonding target can be, for example, a wafer on which semiconductor devices are manufactured. The bonding target may be, for example, a silicon wafer, a silicon wafer on which wiring paths are formed, a glass wafer, a glass panel on which wiring paths are formed, an organic panel (PCB) on which wiring paths are formed, or a metal panel. The wafer on which semiconductor devices are manufactured may be a wafer to which a die on which a semiconductor device is manufactured is already bonded. The die can be, for example, a chip obtained by dicing semiconductor devices. The die may be, for example, a stack of a plurality of dies, a small piece of a material, an optical element, a MEMS, or a structure. The bonding method is not limited to a specific bonding method. For example, bonding may be bonding using an adhesive, temporary bonding using a temporary adhesive, bonding by hybrid bonding, atomic diffusion bonding, vacuum bonding, or bump bonding, and various kinds of temporary bonding and permanent bonding methods can be used.

Industrial application examples will be described. The first application example is manufacturing of a stacked memory. In application to manufacturing of a stacked memory, the bonding target can be a wafer on which a memory serving as a semiconductor device is formed, and the die can be a memory die. For example, in a case where a stacked structure including eight layers is formed by repeating bonding, in bonding of the eighth layer, the bonding target can be a substrate with six layers of memory dies already bonded to a wafer. The final layer can be, for example, a driver die for driving the memory.

The second application example is heterogeneous integration of a processor. The mainstream of conventional processors is a SoC in which a logic circuit and an SRAM are formed in one semiconductor element. To the contrary, in heterogeneous integration, separate wafers are created by applying a process optimal for each element and bonded to manufacture a processor. This can implement cost reduction and yield improvement of processors. In application to heterogeneous integration, the bonding target can be a wafer on which a logic device serving as a semiconductor device is formed, and a die can be a die such as an SRAM, an antenna, or a driver separated after probing. Normally, since different dies are sequentially bonded, bonded objects on the bonding target sequentially increase. For example, in a case where bonding is started from an SRAM, when bonding an element next to the SRAM, the bonding target is a logic wafer to which the SRAM is bonded. When bonding a plurality of dies, as for the order of bonding, bonding is preferably started from a thin die such that a bonding head does not interfere with a bonded die.

The third application example is 2.5D bonding using a silicon interposer. The silicon interposer is a silicon wafer on which wiring paths are formed. The 2.5D bonding is a method of bonding separated dies and electrically connecting the dies using the silicon interposer. In application to die bonding to the silicon interposer, the present disclosure is applied using a silicon wafer on which wiring paths are formed as the bonding target. Normally, since a plurality of types of dies are bonded to the silicon interposer, the bonding target includes even a silicon interposer to which several dies are already bonded. When bonding a plurality of dies, as for the order of bonding, bonding is preferably started from a thin die such that a bonding head does not interfere with a bonded die.

The fourth application example is 2.1D bonding using an organic interposer or a glass interposer. The organic interposer is an organic panel (a PCB substrate or a CCL substrate) used as a package substrate, on which wiring paths are formed. The glass interposer is a glass panel on which wiring paths are formed. The 2.1D bonding is a method of bonding separated dies to the organic interposer or the glass interposer, and electrically bonding the dies by the wiring paths on the interposer. In application to die bonding to the organic interposer, the bonding target is an organic panel on which wiring paths are formed. In application to die bonding to the glass interposer, the bonding target is a glass panel on which wiring paths are formed. Normally, since a plurality of types of dies are bonded to the organic interposer or the glass interposer, the bonding target includes even an organic interposer or a glass interposer to which several dies are already bonded. When bonding a plurality of dies, as for the order of bonding, bonding is preferably started from a thin die such that a bonding head does not interfere with a bonded die.

The fifth application example is temporary bonding in a fan-out package manufacturing process. A fan-out wafer-level package formed by reconstructing and packaging separated dies into a wafer shape using a mold resin or a fan-out panel-level package formed by reconstructing and packaging separated dies into a panel shape can be applied as an advanced package to semiconductor manufacturing. In packaging, rewirings from the dies to bumps are formed, or rewirings that bond different types of dies are formed on a molded reconstructed substrate. If the die array accuracy is low, when transferring the rewiring pattern using a step-and-repeat exposure apparatus, it is impossible to accurately align the rewiring pattern to the dies. For this reason, the dies are required to be arrayed accurately. In application to the fan-out package manufacturing process, the bonding target can be a metal panel. According to the present disclosure, the separated dies may temporarily be bonded to the metal panel by a temporary adhesive. After that, the dies are molded into a wafer shape or a panel shape by a molding apparatus, and peeled from the metal panel after molding, thereby manufacturing a reconstructed wafer or a reconstructed panel. If the present disclosure is applied to this bonding, the bonding position can be adjusted to correct array deformation caused by the molding process.

The sixth application example is heterogeneous substrate bonding. For example, in an infrared image sensor, InGaAs is known as a high-sensitivity material. There has been proposed manufacturing a high-sensitivity high-speed infrared image sensor by using InGaAs for a sensor unit configured to receive light and using silicon capable of implementing high-speed processing for a logic circuit configured to extract data. However, from InGaAs crystal, only wafers whose diameter is as small as 4 inches are mass-produced, which is smaller than a mainstream 300-mm silicon wafer. Hence, there has been proposed a method of bonding a separated die of InGaAs to a 300-mm silicon wafer on which a logic circuit is formed. The present disclosure can also be applied to heterogeneous substrate bonding of bonding substrates made of different materials and having different sizes. In application of the present disclosure to heterogeneous substrate bonding, the bonding target is a substrate with a large diameter such as a silicon wafer, and the separated die is a small piece of a material such as InGaAs. The small piece of the material is a slice of a crystal and is preferably cut into a rectangular shape.

In the following description, directions are indicated by an XYZ coordinate system. Directions parallel to X-, Y-, and Z-axes are X, Y, and Z directions, respectively. The X, Y, and Z directions are directions orthogonal to each other or directions crossing each other.

Figure 2:
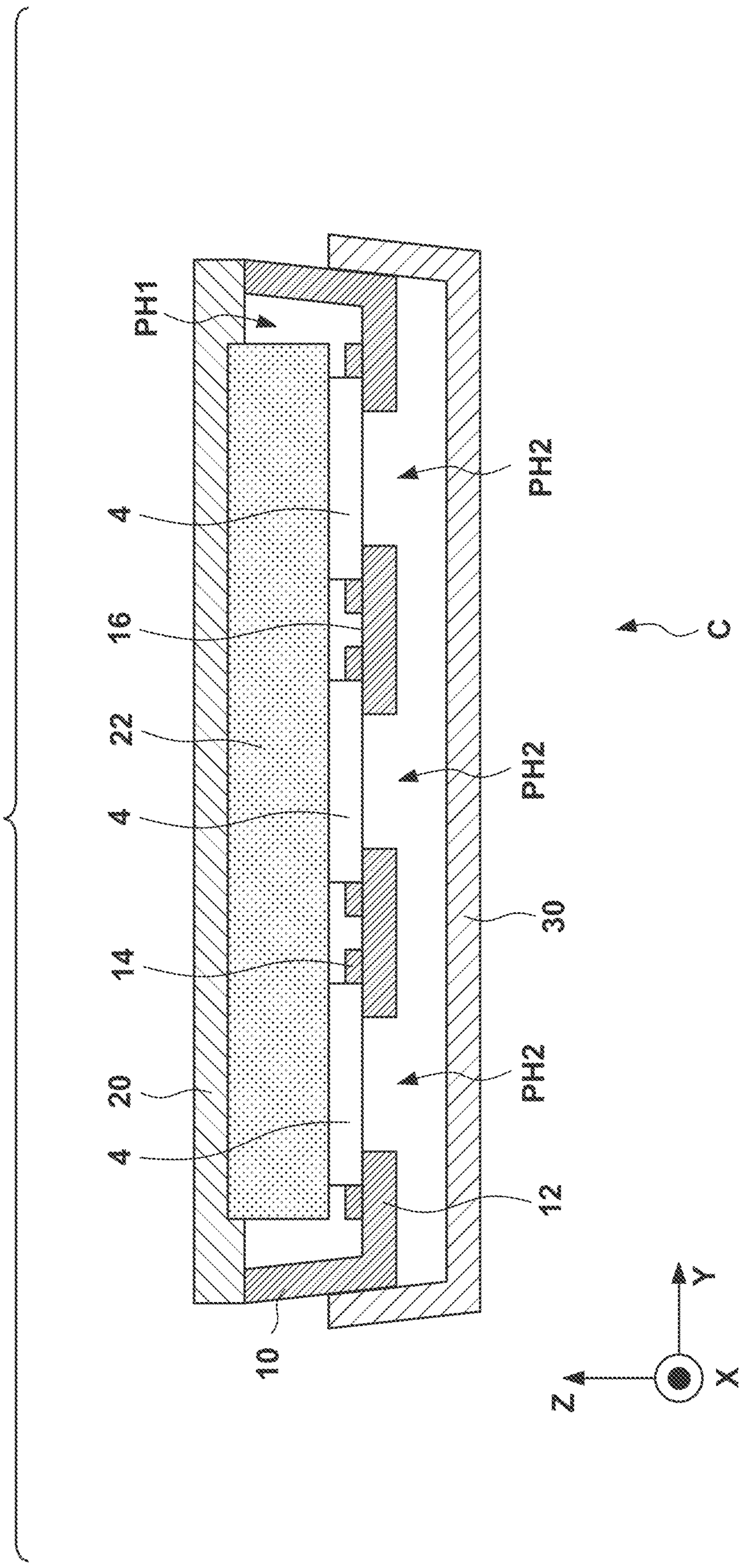
FIG. 2 is a sectional view showing a state in which a plurality of dies are held by the storage container according to the first embodiment.

FIG. 1 is a sectional view of a storage container C according to the first embodiment. FIG. 2 is a sectional view showing a state in which a plurality of dies 4 are held by the storage container C according to the first embodiment. The storage container C is a container for storing the die 4. The storage container C is a container that enables a process of a target bonding surface in a state in which one or a plurality of dies 4 are held. The storage container C can include a main body 10. The main body 10 can include a first through hole PH1 used to remove/insert the die 4 from the Z-axis plus direction. The main body 10 can also include one or a plurality of second through holes PH2 used to process or preprocess the target bonding surfaces of one or the plurality of dies 4 from the Z-axis minus direction in a state in which the die 4 is held by the storage container C. The main body 10 can also include a holder 12 configured to hold one or a plurality of dies 4. The one or the plurality of second through holes PH2 can be provided in the holder 12. The die 4 can be removed/inserted from/into the main body 10 via the first through hole PH1.

The storage container C can include a first lid 20 attachable to the main body 10 to cover the first through hole PH1. The first through hole PH1 can be released by opening the first lid 20 or detaching the first lid 20 from the main body 10. In a state in which the first through hole PH1 is released, one or a plurality of dies 4 can be arranged in the holder 12 of the main body 10 via the first through hole PH1. The storage container C further includes a pressing portion 22 configured to press one or a plurality of dies against the holder 12 or the main body 10 in a state in which the first lid 20 is attached to the main body 10. The first lid 20 can be locked or fixed to the main body 10 by a lock portion such as a claw. In a state in which the first lid 20 is attached to the main body 10, the die 4 can be sandwiched between the pressing portion 22 and the holder 12. The pressing portion 22 can be formed by a stretchable member or an elastically deformable member.

The storage container C can include a second lid 30 attachable to the main body 10 to cover the one or the plurality of second through holes PH2. The one or the plurality of second through holes PH2 can be released by opening the second lid 30 or detaching the second lid 30 from the main body 10. The second through hole PH2 can be configured to allow the one or the plurality of dies 4 held by the holder 12 to be processed via the one or the plurality of second through holes PH2.

The holder 12 can include one or a plurality of regulating portions 14 that regulate the positions of the one or the plurality of dies 4. The holder 12 includes a first surface 16 that faces the first lid 20 in a state in which the first lid 20 is attached to the main body 10, and each of the one or the plurality of regulating portions 14 is a tapered portion tilted with respect to the first surface 16. Alternatively, each of the plurality of regulating portions can be formed by one or a plurality of projections projecting from the first surface 16. The regulating portions 14 may be projections arranged to surround the whole circumference of the die 4 or may be a plurality of projections arranged apart from each other to surround the die 4. The components forming the storage container C, for example, the main body 10, the first lid 20 and the second lid 30, the pressing portion 22, and the regulating portions 14 are preferably formed not to generate foreign substances and impurities.

The storage container C can have readable identification information. The identification information can include at least one of information used to identify the storage container C itself and information used to identify the die 4 stored in the container C. The identification information can be rewritable information, and the storage container C can include a nonvolatile memory for holding the identification information.

Figure 14A:
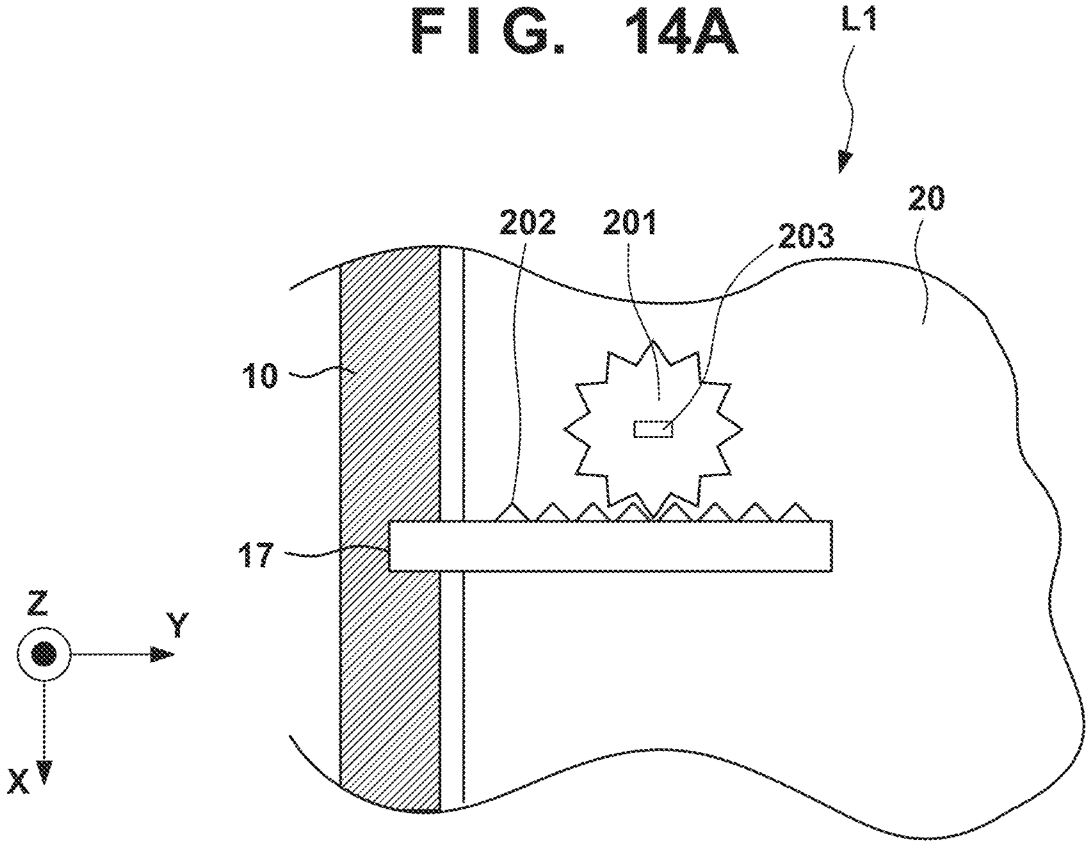
FIGS. 14A and 14B are views schematically showing an example of a first fixing mechanism that locks or fixes a first lid to a main body.
Figure 14B:
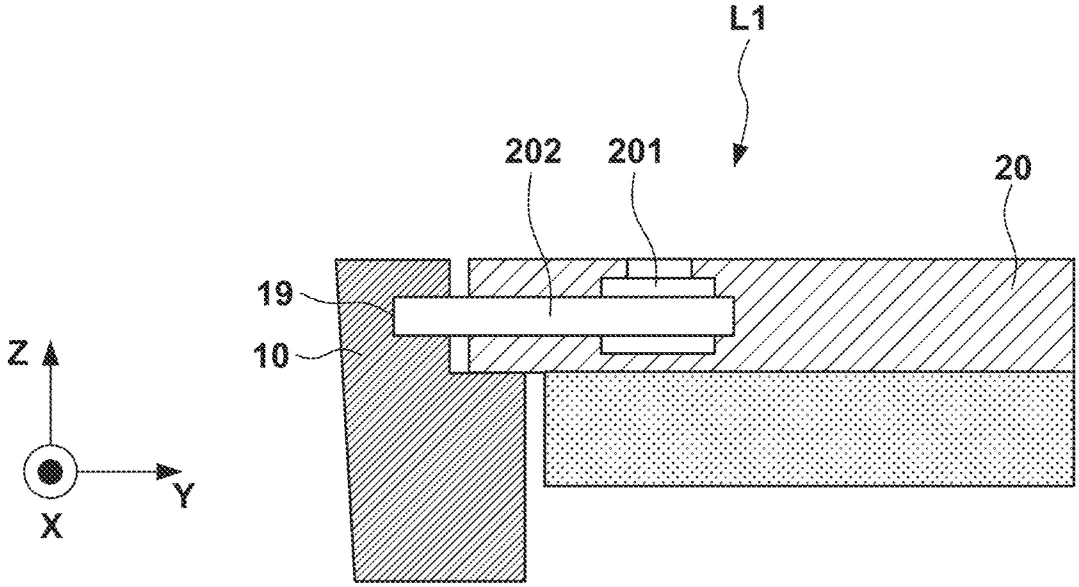

FIGS. 14A and 14B schematically show an example of a first fixing mechanism L1 that locks or fixes the first lid 20 to the main body 10. The first fixing mechanism L1 may be understood as a first lock mechanism. The first fixing mechanism L1 can include a gear 201 and a rack 202. The gear 201 and the rack 202 form a rack-and-pinion mechanism. In the example shown in FIGS. 14A and 14B, when the driving end of an opening/closing mechanism (not shown) is connected to a connecting portion 203 of the gear 201, and the gear 201 is rotated, the rack 202 slides in the Y direction. When the rack 202 slides and is inserted into an engaging portion 17 of the main body 10, the first lid 20 can be locked or fixed to the main body 10. This may be a state in which the first lid 20 is locked. To the contrary, when the rack 202 slides and is removed from the engaging portion 17 of the main body 10, the lock or fixing of the first lid 20 to the main body 10 can be canceled. The first fixing mechanism L1 as described above may be provided on each of a plurality of locations.

Figure 15:
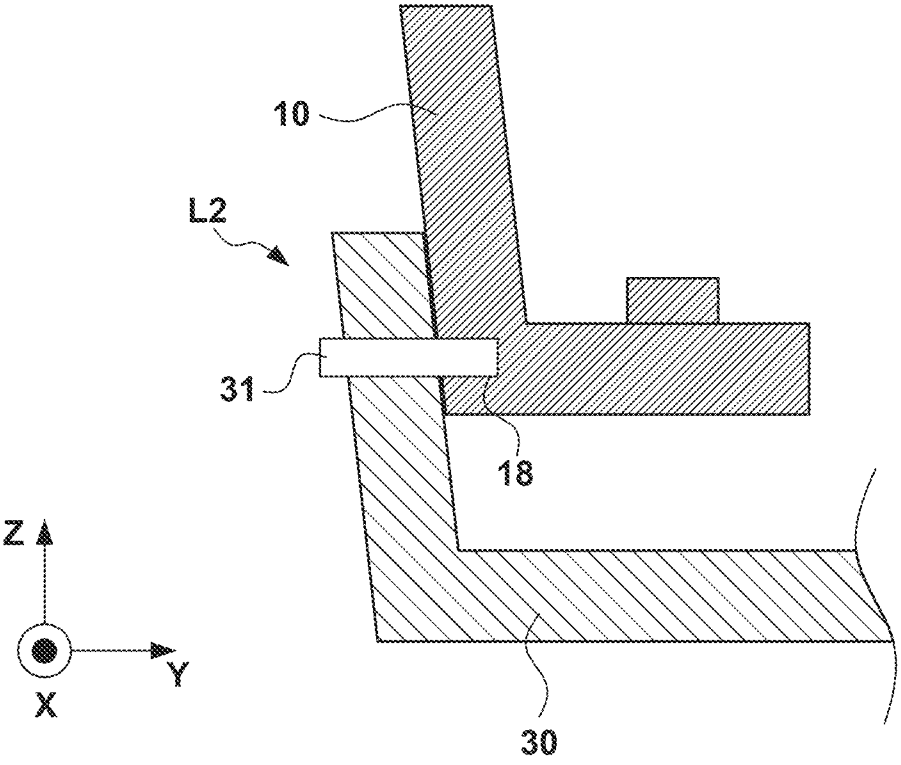
FIG. 15 is a view schematically showing an example of a second fixing mechanism that locks or fixes a second lid to the main body.

FIG. 15 exemplifies a second fixing mechanism L2 that locks or fixes the second lid 30 to the main body 10. The second fixing mechanism L2 may be understood as a second lock mechanism. In the example shown in FIG. 15, when a slide member 31 is inserted into an engaging portion 18 of the main body 10 by a driving mechanism (not shown), the second lid 30 is locked or fixed to the main body 10. This may be a state in which the second lid 30 is locked. To the contrary, when the slide member 31 is removed from the engaging portion 18 of the main body 10, the lock or fixing of the second lid 30 to the main body 10 can be canceled. The second fixing mechanism L2 as described above may be provided on each of a plurality of locations.

Figure 3:
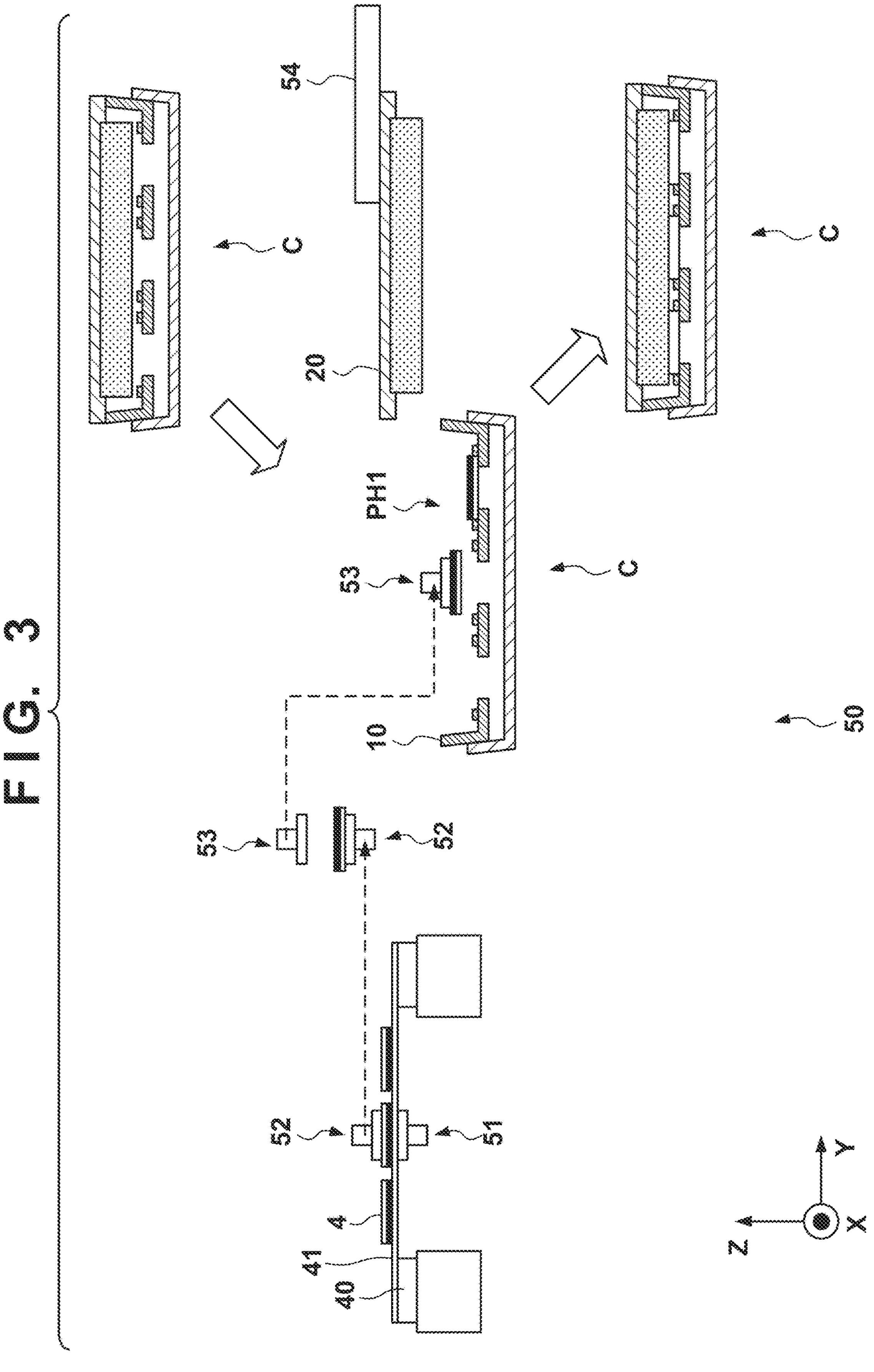
FIG. 3 is a view schematically showing an operation of a transfer apparatus according to the first embodiment which transfers a diced die to the storage container according to the first embodiment.

FIG. 3 schematically shows an operation of a transfer apparatus 50 that transfers a diced die 4 to the storage container C. The transfer apparatus 50 can be configured to transfer the one or the plurality of dies 4 to the empty storage container C. The die 4 can be diced from a semiconductor wafer by a dicing apparatus (not shown), adhered to a dicing frame 40, and arranged on a dicing tape 41. Spaces are formed between the plurality of dies 4 by stretching the dicing tape 41 by an expander (not shown). The die 4 to be picked up can be peeled from the dicing tape 41 by a release head 51 and picked up by a pickup head 52. In FIG. 3, a white side of the die 4 indicates a device side, and a black side of the die 4 indicates a silicon side. In this example, the surface on the white side is the surface to be bonded to a bonding target. The die 4 picked up by the pickup head 52 can be turned upside down and transferred to a transfer head 53. The die 4 can be transferred to the transfer head 53 such that the black side (silicon side) is held by the transfer head 53.

The storage container C to which the die 4 is to be transferred can be loaded, as empty, into the transfer apparatus 50, and the first lid 20 can be unlocked by an operation mechanism 54 to release the first through hole PH1 of the main body 10. If the storage container C includes the first fixing mechanism L1 described with reference to FIGS. 14A and 14B, the driving end of the opening/closing mechanism (not shown) is connected to the connecting portion 203 of the gear 201, and the gear 201 is rotated, thereby unlocking the first lid 20. The method of operating the first lid 20 to release the first through hole PH1 can be arbitrary. For example, the first lid 20 may be slid, the first lid 20 may be separated from the main body 10, the first lid 20 may be rotated, or another method may be used.

After that, the transfer head 53 arranges or transfers the die 4 into the first through hole PH1 of the main body 10 via the first through hole PH1 of the main body 10 of the storage container C. After that, the operation mechanism 54 operates the first lid 20 to close the first through hole PH1 of the main body 10, thereby locking the first lid 20. If the storage container C includes the first fixing mechanism L1 described with reference to FIGS. 14A and 14B, the driving end of the opening/closing mechanism (not shown) is connected to the connecting portion 203 of the gear 201, and the gear 201 is rotated, thereby locking the first lid 20. After that, the storage container C is unloaded from the transfer apparatus 50.

If the dies 4 on the dicing frame 40 run out during a series of transfer processes, the dicing frame 40 can be exchanged. The dies 4 can be inspected in advance, and only Known Good Dies (KGDs) can be transferred to the storage container C. After the die 4 is transferred to or stored in the storage container C, it is inspected whether the transfer or storage is correctly done, and the result can be notified to a management apparatus. Since cutting powder may stick when picking up the die 4 from the dicing frame 40, the die 4 may be washed before it is transferred to the storage container C.

Figure 4:
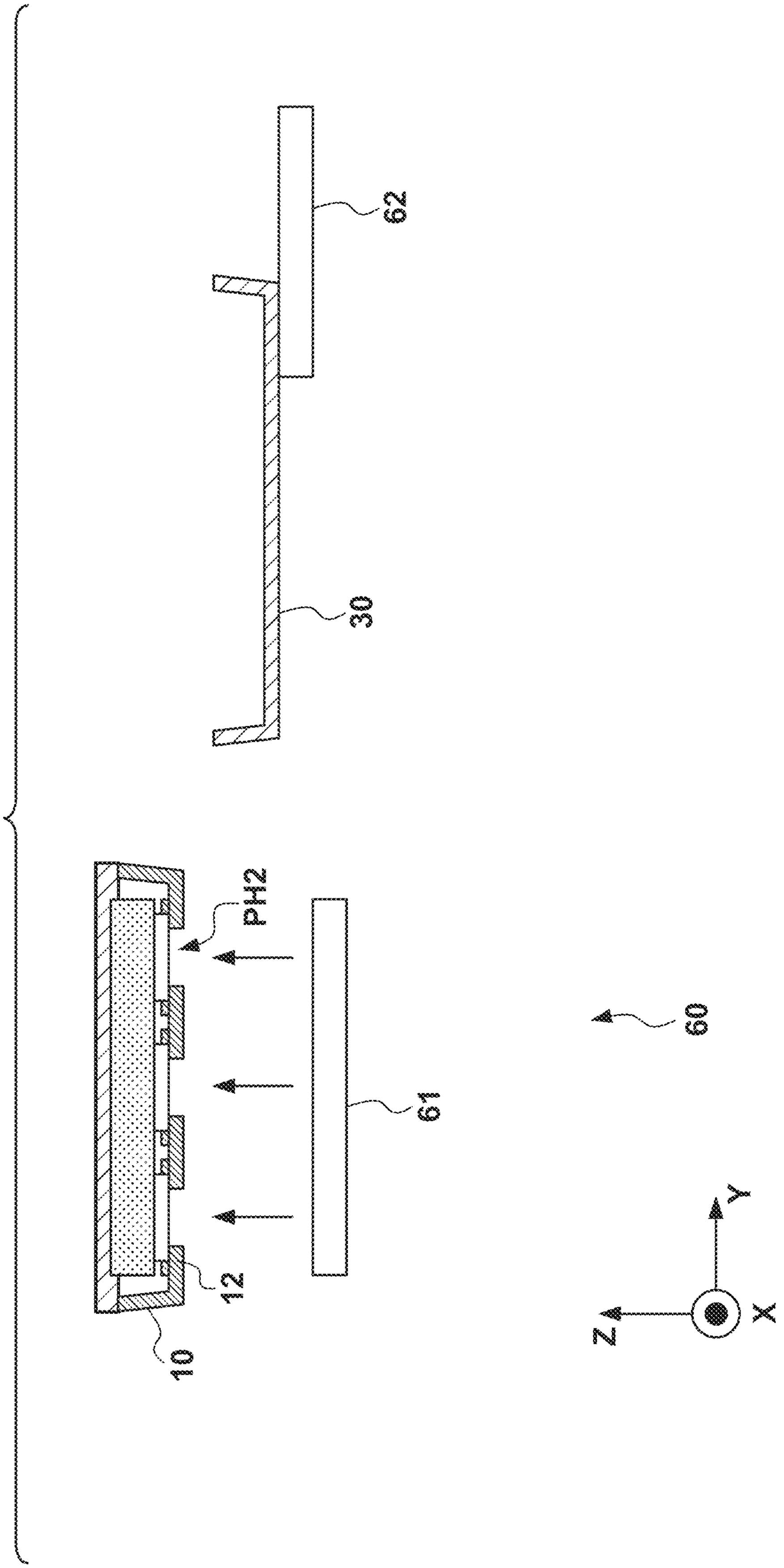
FIG. 4 is a view schematically showing an operation of processing the die held by the storage container according to the first embodiment by a processing apparatus according to the first embodiment.

FIG. 4 schematically shows an operation of processing the die 4 held by the storage container C by a processing apparatus 60. After the storage container C is conveyed to the processing apparatus 60, the second lid 30 can be unlocked by an operation mechanism 62 to release the second through hole PH2 of the main body 10. If the storage container C includes the second fixing mechanism L2 described with reference to FIG. 15, the slide member 31 of the opening/closing mechanism (not shown) is slid, thereby unlocking the second lid 30. The method of operating the second lid 30 to release the second through hole PH2 can be arbitrary. For example, the second lid 30 may be slid, the second lid 30 may be separated from the main body 10, the second lid 30 may be rotated, or another method may be used.

The processing apparatus 60 includes a processor 61. The processor 61 processes, via the second through hole PH2, the die 4 held by the storage container C. The process of the die 4 by the processor 61 can include at least one of, for example, a process of activating the surface (target bonding surface) of the die 4, a process of washing the surface of the die 4, and a process of making the surface of the die 4 hydrophilic. The process of activating the surface of the die 4 can include, for example, a process of irradiating the surface of the die 4 with plasma. The process of washing the surface of the die 4 can include, for example, a process of washing the surface of the die 4 using a surfactant, a fluid, pure water, or the like. The process of making the surface of the die 4 hydrophilic can include, for example, a process of providing a hydroxyl group to the surface of the die 4.

After the process of the die 4 is ended, the operation mechanism 62 operates the second lid 30 to close the second through hole PH2 of the main body 10, thereby locking the second lid 30. If the storage container C includes the second fixing mechanism L2 described with reference to FIG. 15, the slide member 31 of the opening/closing mechanism (not shown) is slid, thereby locking the second lid 30.

The process of the die 4 stored in the storage container C may be executed by a plurality of processing apparatuses. During the release of the second lid 30, the space where the plurality of processing apparatuses are arranged is preferably maintained in a state in which the washing degree is high, for example, at a cleanliness of about class 1 such that no foreign substance stick to the surface (target bonding surface) of the die 4.

A processing method of processing the die by the processing apparatus 60 can include a release step of releasing the second lid 30 of the storage container C, a processing step of processing, via the second through hole PH2, the die 4 held by the storage container C, and a closing step of closing the second lid 30. The processing step can include at least one of a process of activating the surface of the die 4, a process of washing the surface, and a process of making the surface hydrophilic.

Figure 5:
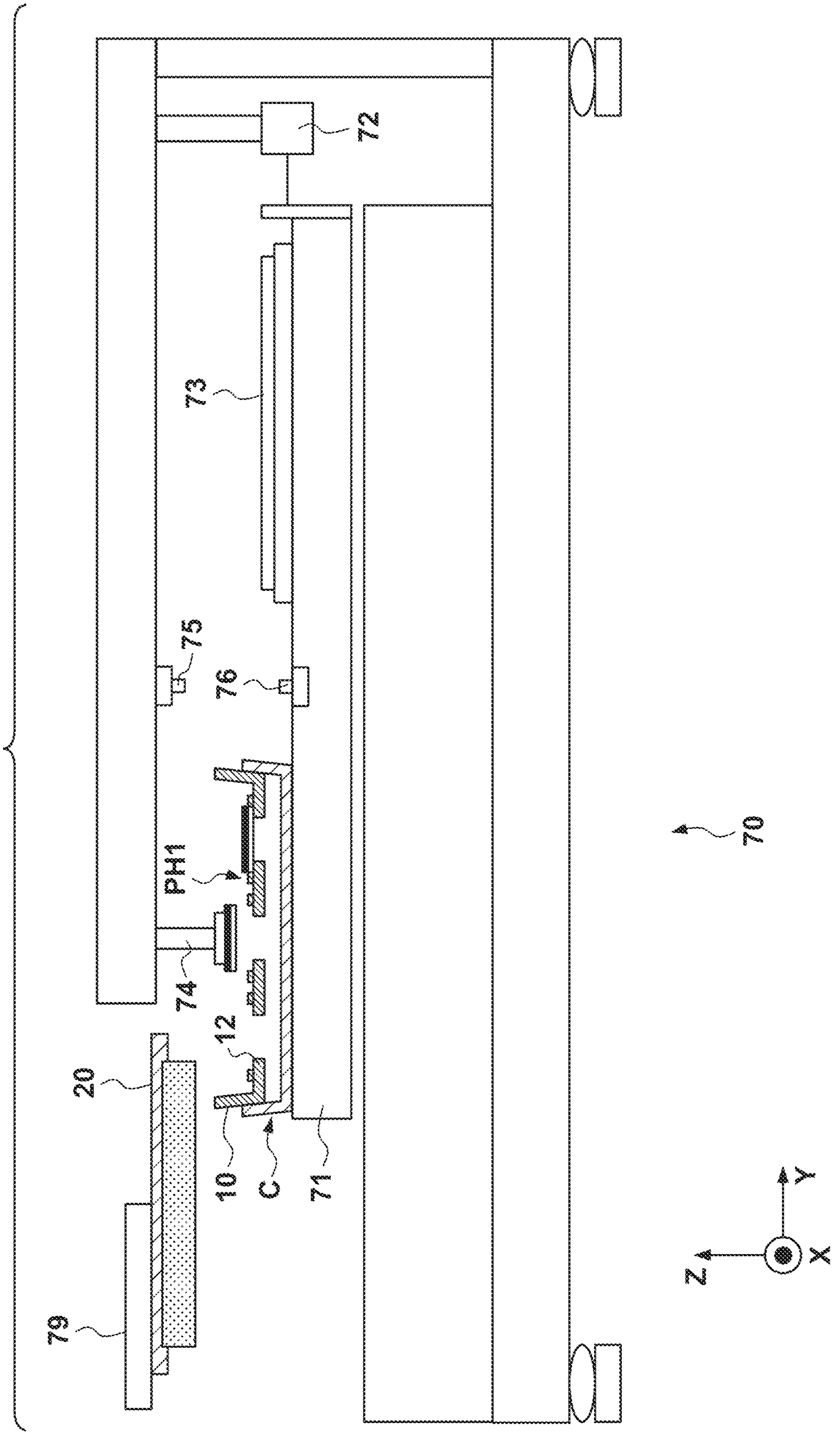
FIG. 5 is a view schematically showing an operation of a bonding apparatus according to the first embodiment which extracts a die from the storage container according to the first embodiment and bonds the die to a bonding target.

FIG. 5 schematically shows an operation of a bonding apparatus 70 that extracts the die 4 from the storage container C and bonds it to a wafer 73 that is a bonding target. The bonding apparatus 70 can include an opening/closing mechanism 79 for opening/closing the first lid 20 of the storage container C. The bonding apparatus 70 can also include a bonding head 74 (operation mechanism) that extracts the die 4 held by the holder 12 of the main body 10 of the storage container C from the storage container C via the first through hole PH1 and bonds it to the wafer 73 that is the bonding target.

The bonding apparatus 70 can include a stage 71 and a stage driving mechanism that drives the stage 71. The stage driving mechanism can drive the stage 71 concerning, for example, a total of six axes including the X-axis, the Y-axis, the Z-axis, and rotations about these axes. The bonding apparatus 70 can include a measuring device 72 that measures the position and rotation of the stage 71. The bonding apparatus 70 can be configured to perform feedback control of the position and rotation of the stage 71 based on the output of the measuring device 72.

The stage 71 can be configured to hold the storage container C and the wafer 73. The storage container C can be loaded into the bonding apparatus 70 and, after the first lid 20 is detached from the main body 10 by the opening/closing mechanism 79, arranged on the stage 71. Alternatively, after the storage container C is loaded into the bonding apparatus 70 and arranged on the stage 71, the first lid 20 can be detached from the main body 10 by the opening/closing mechanism 79. If the storage container C includes the first fixing mechanism L1 described with reference to FIGS. 14A and 14B, the driving end of the opening/closing mechanism 79 is connected to the connecting portion 203 of the gear 201, and the gear 201 is rotated, thereby unlocking the first lid 20. The first lid 20 detached from the main body 10 can be held by the opening/closing mechanism 79.

The die 4 held by the main body 10 of the storage container C can be held by the bonding head 74 and extracted from the storage container C via the first through hole PH1. At this time, the bonding head 74 may be moved up and down, or the stage 71 that can be accurately positioned may be moved up and down. A wafer observation camera 75 observes the wafer 73 that is the bonding target loaded onto the stage 71 while moving the stage 71, thereby correctly obtaining the position of a target bonding location. As for the die 4 held by the bonding head 74, the stage 71 is driven such that the bonding head 74 is located immediately above a chip observation camera 76, thereby correctly obtaining the position of the die 4 on the bonding head 74.

Figure 6:
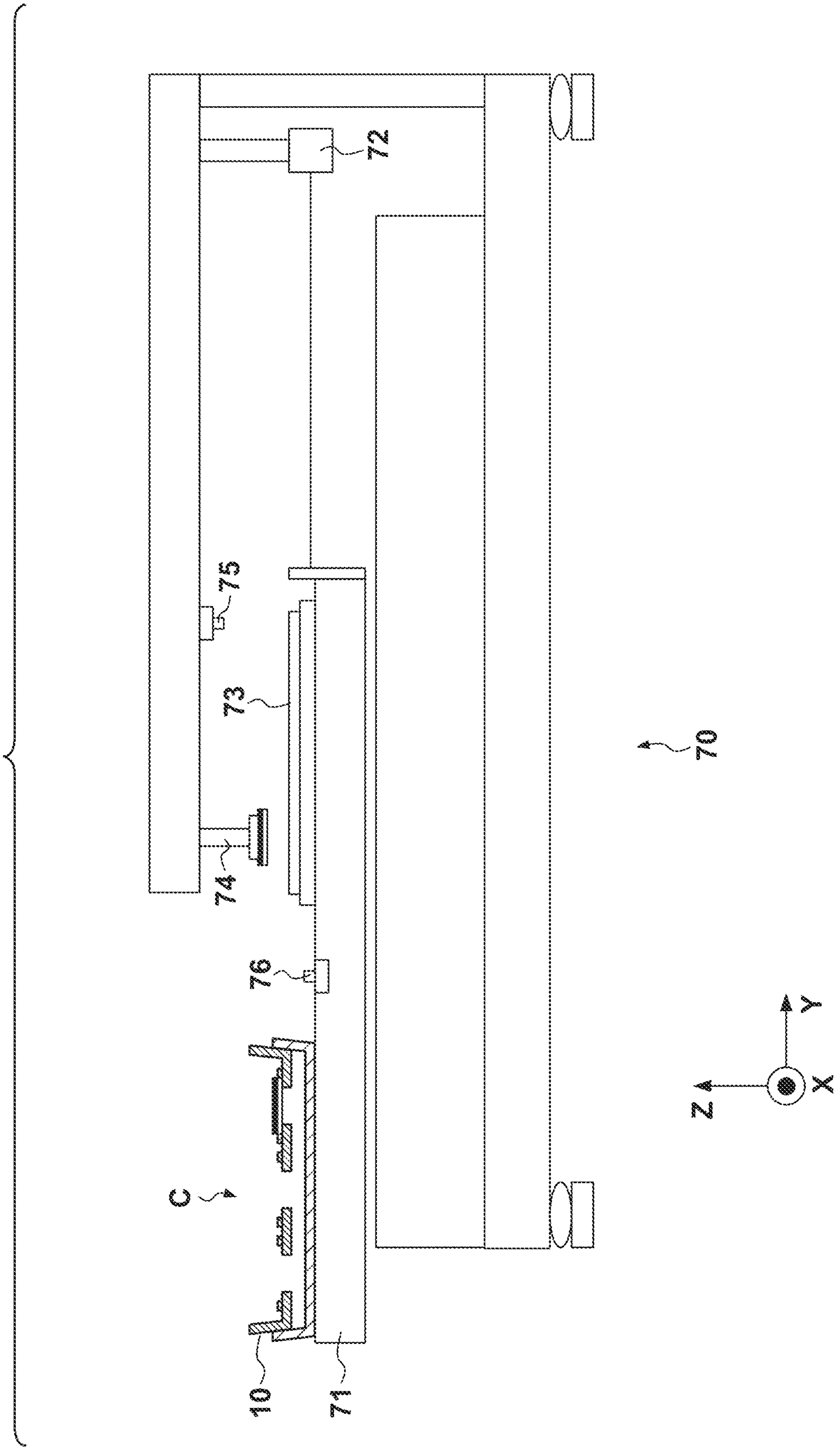
FIG. 6 is a view schematically showing an operation of the bonding apparatus according to the first embodiment which extracts a die from the storage container according to the first embodiment and bonds the die to a bonding target.

Based on the position of the target bonding location of the wafer 73 and the position of the die 4 held by the bonding head 74, the die 4 is correctly bonded to the target bonding location of the wafer 73, as shown in FIG. 6. The bonding operation can be performed for a plurality of target bonding locations on the wafer 73. At this time, if the dies 4 in the storage container C run out, the storage container C can be exchanged. In a case of heterogeneous bonding for bonding a plurality of types of dies 4 to one wafer 73, different types of dies 4 can be bonded to the wafer 73 using the storage container C that stores the different types of processed dies 4.

The inspection result of semiconductor elements formed on the wafer 73 is provided to the bonding apparatus 70 via a network, a die determined as non-defective can be bonded to a semiconductor element determined as non-defective. In a process after this, if all semiconductor elements need to have dies bonded thereto, a die determined as defective may be bonded to a semiconductor element determined as defective. In this example, one storage container C is arranged on the stage 71. However, a plurality of storage containers C may be arranged on the stage 71. A stage for holding the storage container C may be provided independently of the stage for holding the wafer 73. If a foreign substance sticks to the bonding surface of the die, a bonding failure occurs. Hence, the region where the die is extracted from the storage container C and handled in the bonding apparatus 70, can be maintained in a state in which the washing degree is high, for example, at a cleanliness of about class 1. The wafer 73 with the dies bonded to all target bonding locations is unloaded from the bonding apparatus 70, and post-processes such as annealing, dicing, test, and resin encapsulation can be performed.

The bonding apparatus 70 may be configured to align the wafer 73 and the die 4 by transmissive observation in a state in which these are overlaid. A position observation mark may be provided on the target bonding surface of the die 4, and the position of the die 4 may be measured by observing this. Immediately before bonding, a camera for observing the die 4 and the wafer 73 may be inserted between these, and alignment may be performed using the camera.

A bonding method of bonding the die 4 to a bonding target by the bonding apparatus 70 can include a release step of releasing the first lid of the storage container C, and an extraction step of extracting the die 4 held by the storage container C from the storage container C via the first through hole PH1. The bonding method can also include a bonding step of bonding the die 4 extracted from the storage container C to the bonding target.

Alternatively, a bonding method according to an embodiment can include a release step of releasing the second lid 30 of the storage container C, a processing step of processing, via the second through hole PH2, the die 4 held by the storage container C, and a closing step of closing the second lid 30. The processing step can include at least one of a process of activating the surface of the die 4, a process of washing the surface, and a process of making the surface hydrophilic. The bonding method can also include a transfer step of transferring the storage container C to the bonding apparatus. The bonding method can also include a release step of releasing the first lid 20 of the storage container C, an extraction step of extracting the die 4 held by the storage container C from the storage container C via the first through hole PH1, and a bonding step of bonding the die 4 extracted from the storage container C to the bonding target.

Figure 7:
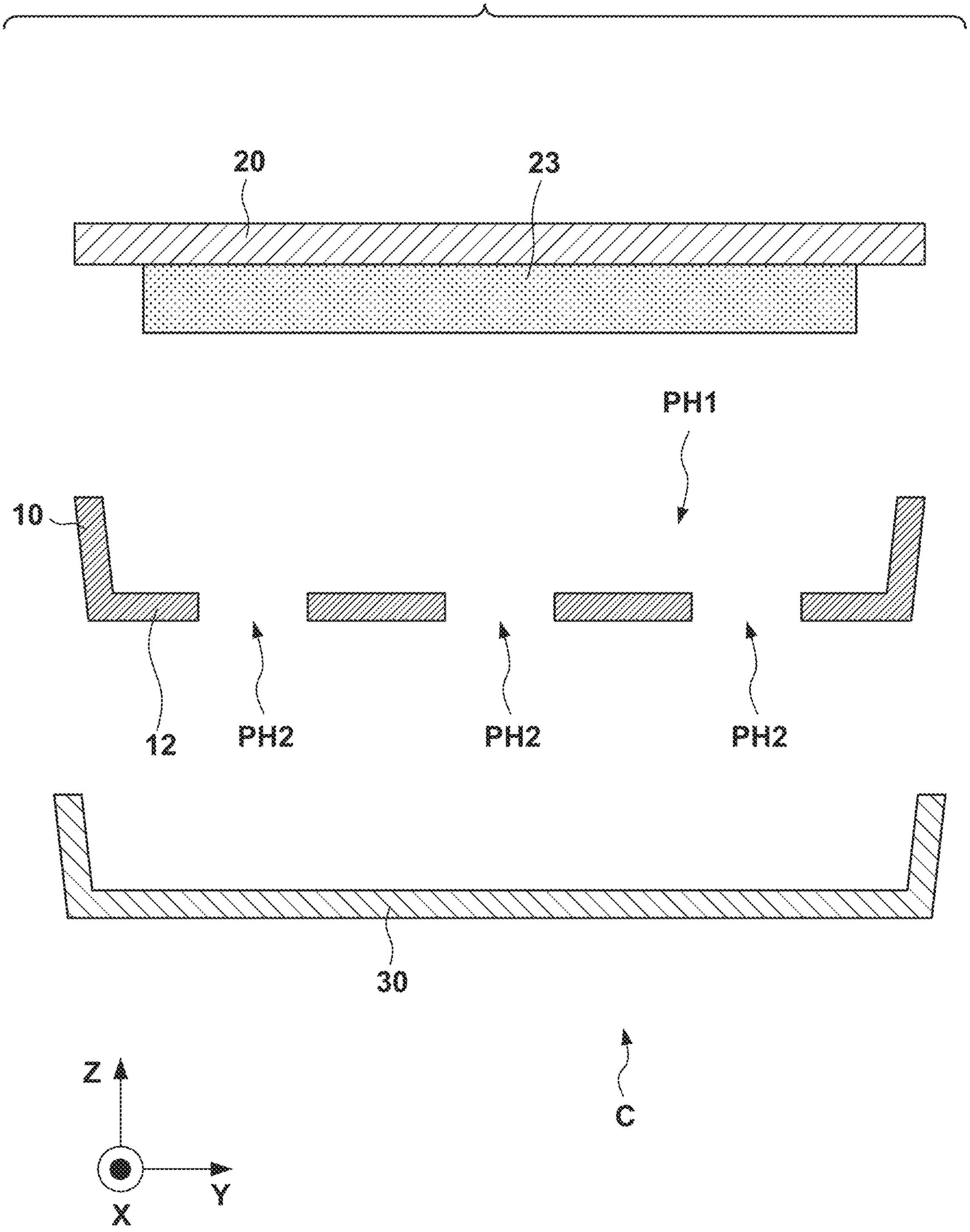
FIG. 7 is a sectional view of a storage container according to the second embodiment.

The second embodiment will be described below. Matters that are not mentioned as the second embodiment can comply with the first embodiment. FIG. 7 is a sectional view of a storage container C according to the second embodiment. In the second embodiment, one or a plurality of dies 4 are fixed or temporarily adhered to a first lid 20 by a temporary adhesive layer 23. Hence, the first lid 20 functions as a holder for holding the one or the plurality of dies 4. The temporary adhesive layer 23 may be formed by a temporary adhesive applied in a transfer apparatus 50 or may be a repetitively usable temporary adhesive layer. If an ultraviolet peelable temporary adhesive is used, the first lid 20 preferably includes a window (for example, glass) that transmits ultraviolet rays.

Figure 8:
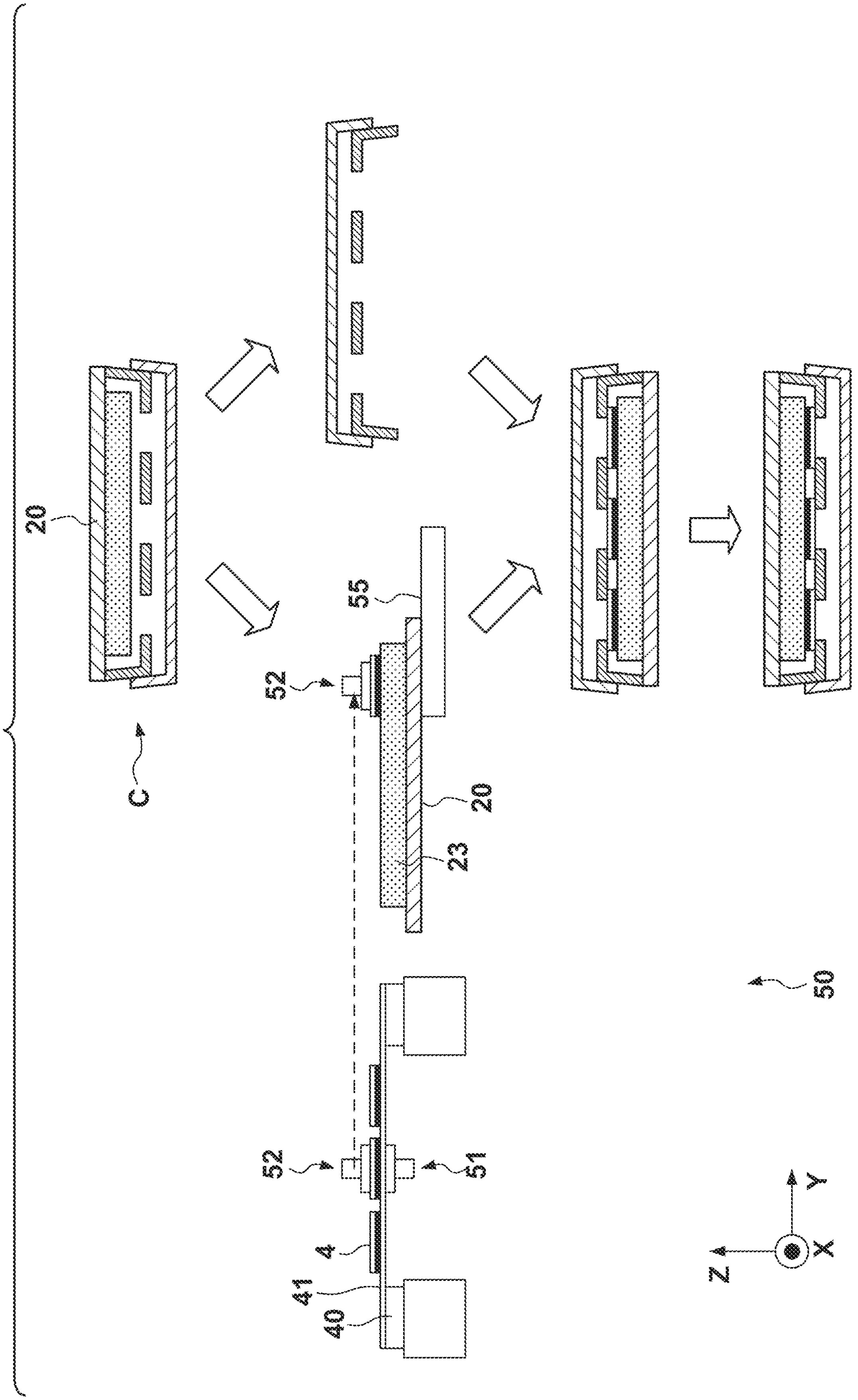
FIG. 8 is a view schematically showing an operation of a transfer apparatus according to the second embodiment which transfers a diced die to the storage container according to the second embodiment.

FIG. 8 schematically shows an operation of a transfer apparatus 50 according to the second embodiment which transfers the diced die 4 to the storage container C. The transfer apparatus 50 can be configured to transfer the one or the plurality of dies 4 to the empty storage container C. The die 4 can be diced from a semiconductor wafer by a dicing apparatus, adhered to a dicing frame 40, and arranged on a dicing tape 41. Spaces are formed between the plurality of dies 4 by stretching the dicing tape 41 by an expander (not shown). The die 4 to be picked up can be peeled from the dicing tape 41 by a release head 51 and picked up by a pickup head 52. In FIG. 8, a white side of the die 4 indicates a device side, and a black side of the die 4 indicates a silicon side. In this example, the surface on the white side is the surface to be bonded to a bonding target.

The storage container C to which the die 4 is to be transferred can be loaded, as empty, into the transfer apparatus 50 and turned upside down in the transfer apparatus 50. Alternatively, the storage container C in an inverted state may be loaded into the transfer apparatus 50. In the storage container C, the first lid 20 is unlocked by an operation mechanism 55 to release a first through hole PH1 of a main body 10.

In the transfer apparatus 50, a temporary adhesive can be applied to the first lid 20 by an application mechanism (not shown) to form the temporary adhesive layer 23. After that, the die 4 picked up by the pickup head 52 is arranged on the temporary adhesive layer 23 and temporarily adhered to the first lid 20 by the temporary adhesive layer 23. Then, after all dies 4 are temporarily adhered to the first lid 20 by the temporary adhesive layer 23, the operation mechanism 55 operates the first lid 20 to close the first through hole PH1 of the main body 10, thereby locking the first lid 20.

A processing apparatus 60 can process the die 4 held by the storage container C in accordance with the first embodiment.

A bonding apparatus 70 can include a peeling portion configured to peel the die 4 temporarily adhered to the first lid 20 by the temporary adhesive layer 23, in addition to the configuration of the first embodiment. For example, if the temporary adhesive layer 23 is formed by an ultraviolet peelable temporary adhesive, the peeling portion can be configured to irradiate the temporary adhesive layer 23 with ultraviolet rays. For example, if the temporary adhesive layer 23 is formed by a heat peelable temporary adhesive, the peeling portion can be configured to apply heat to the temporary adhesive layer 23. For example, if the temporary adhesive layer 23 is formed by a temporary adhesive that is peeled by an impact, the peeling portion can be configured to apply an impact to the temporary adhesive layer 23.

Figure 9:
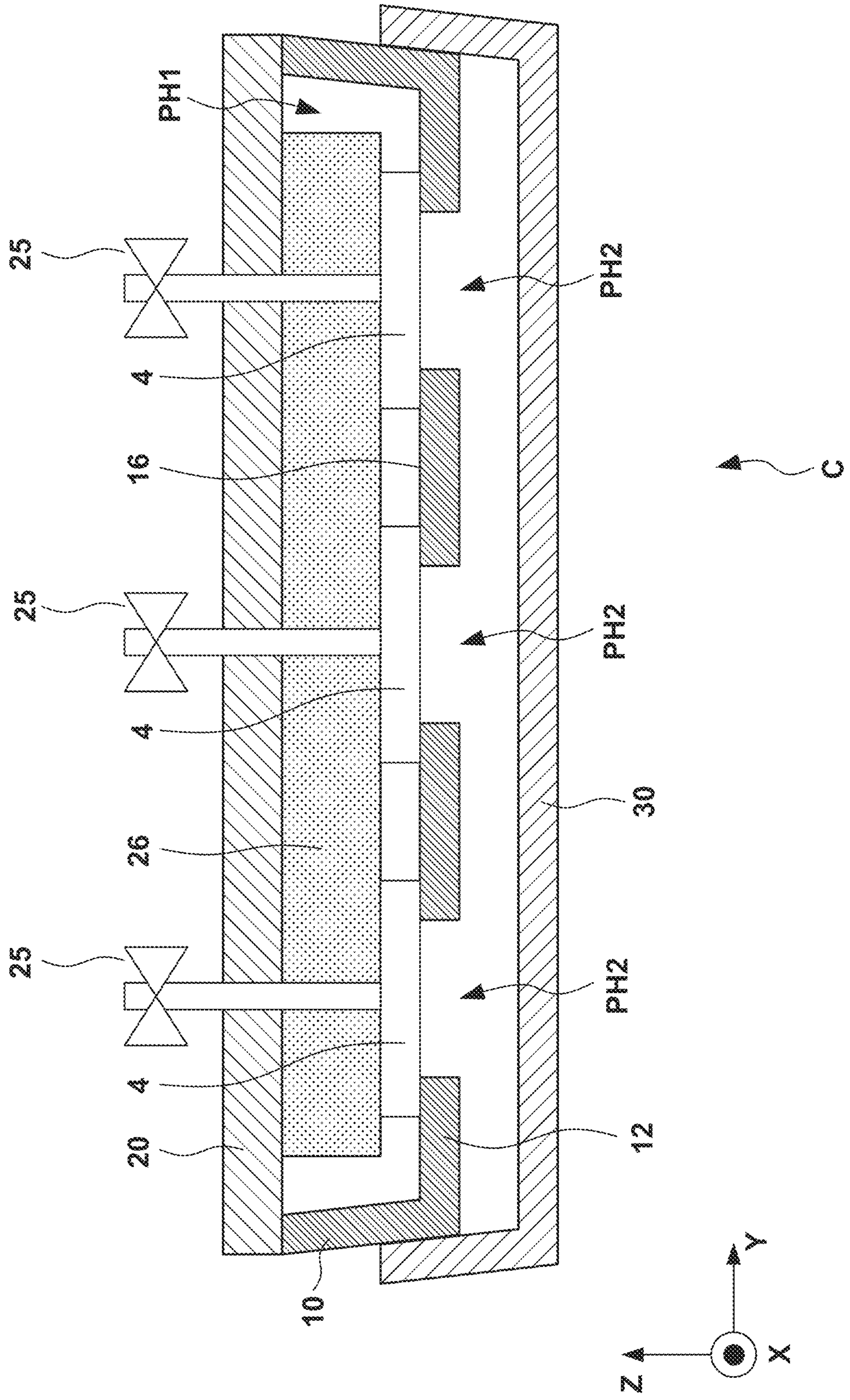
FIG. 9 is a sectional view of a storage container according to the third embodiment.

The third embodiment will be described below. Matters that are not mentioned as the third embodiment can comply with the first embodiment. FIG. 9 is a sectional view of a storage container C according to the third embodiment. In the third embodiment, a plurality of dies are fixed to a first lid 20 by vacuum suction. Hence, the first lid 20 functions as a holder for holding one or a plurality of dies 4. The first lid 20 is provided with a vacuum suction unit 25 that vacuum-sucks the die 4. To individually control vacuum suction of the plurality of dies 4, a plurality of vacuum suction units 25 can be provided on the first lid 20. A solenoid valve can be provided in the vacuum suction unit

25. The first lid 20 may be provided with a suction pad 26 configured to hold the one or the plurality of dies 4 by vacuum suction.

Figure 10:
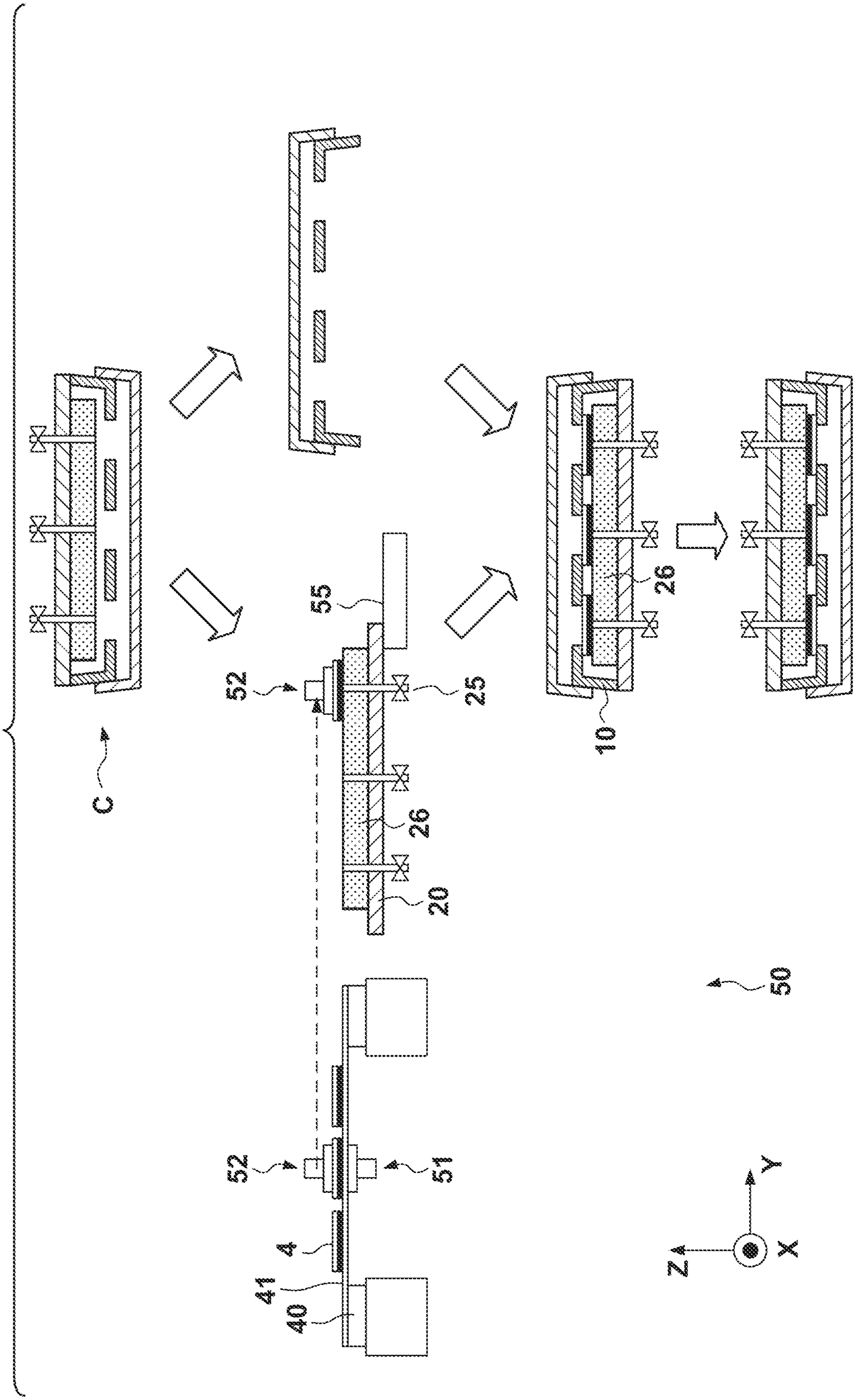
FIG. 10 is a view schematically showing an operation of a transfer apparatus according to the third embodiment which transfers a diced die to the storage container according to the third embodiment.

FIG. 10 schematically shows an operation of a transfer apparatus 50 according to the third embodiment which transfers the diced die 4 to the storage container C. The transfer apparatus 50 can be configured to transfer the one or the plurality of dies 4 to the empty storage container C. The die 4 can be diced from a semiconductor wafer by a dicing apparatus, adhered to a dicing frame 40, and arranged on a dicing tape 41. Spaces are formed between the plurality of dies 4 by stretching the dicing tape 41 by an expander (not shown). The die 4 to be picked up can be peeled from the dicing tape 41 by a release head 51 and picked up by a pickup head 52. In FIG. 10, a white side of the die 4 indicates a device side, and a black side of the die 4 indicates a silicon side. In this example, the surface on the white side is the surface to be bonded to a bonding target.

The storage container C to which the die 4 is to be transferred can be loaded, as empty, into the transfer apparatus 50 and turned upside down in the transfer apparatus 50. Alternatively, the storage container C in an inverted state may be loaded into the transfer apparatus 50. In the storage container C, the first lid 20 is unlocked by an operation mechanism 55 to release a first through hole PH1 of a main body 10.

The operation mechanism 55 can hold or arrange the first lid 20 with the vacuum suction surface or the suction pad 26 facing up. After that, the die 4 picked up by the pickup head 52 can be arranged on the vacuum suction surface or the suction pad 26 of the first lid, vacuum-sucked to the first lid 20 by the vacuum suction unit 25, and held by the first lid 20. Then, after all dies 4 are held by the first lid 20 by vacuum suction, the operation mechanism 55 operates the first lid 20 to close the first through hole PH1 of the main body 10, thereby locking the first lid 20. The die 4 may be sandwiched by the suction pad 26 and the main body 10 and held.

A processing apparatus 60 can process the die 4 held by the storage container C in accordance with the first embodiment. A bonding apparatus 70 may include a controller that controls the vacuum suction unit 25, in addition to the configuration of the first embodiment.

Figure 11:
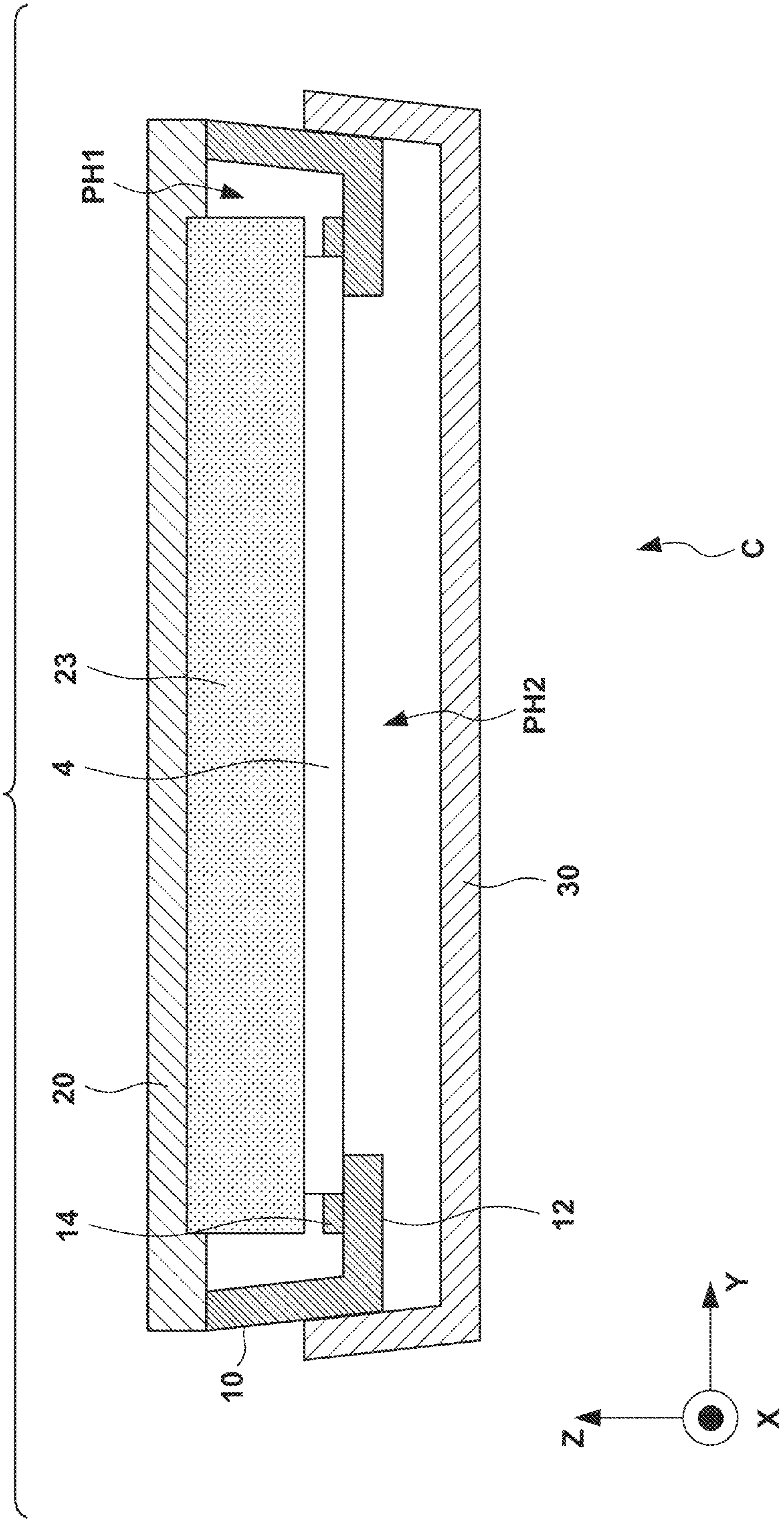
FIG. 11 is a sectional view of a storage container according to the fourth embodiment.

FIG. 11 is a sectional view of a storage container C according to the fourth embodiment. Matters that are not mentioned as the fourth embodiment can comply with the first to third embodiments. In the fourth embodiment, the storage container C is configured to store only one die 4. FIG. 11 shows an example in which the die 4 is fixed or temporarily adhered to a first lid 20 by a temporary adhesive layer 23. However, the method of fixing the die 4 may comply with the first or third embodiment.

Figure 12:
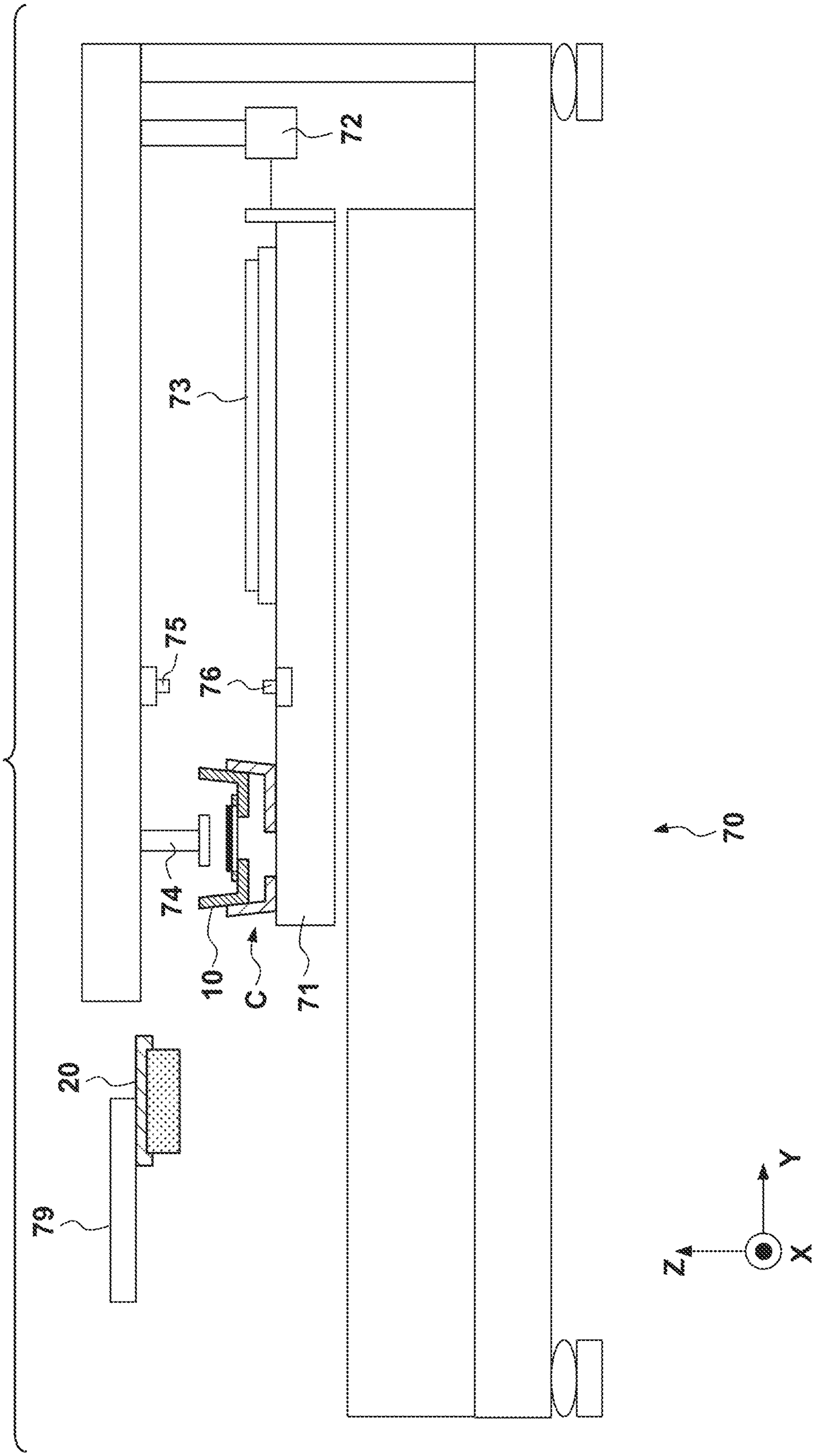
FIG. 12 is a view schematically showing an operation of a bonding apparatus according to the fourth embodiment which extracts a die from the storage container according to the fourth embodiment and bonds the die to a bonding target.
Figure 13:
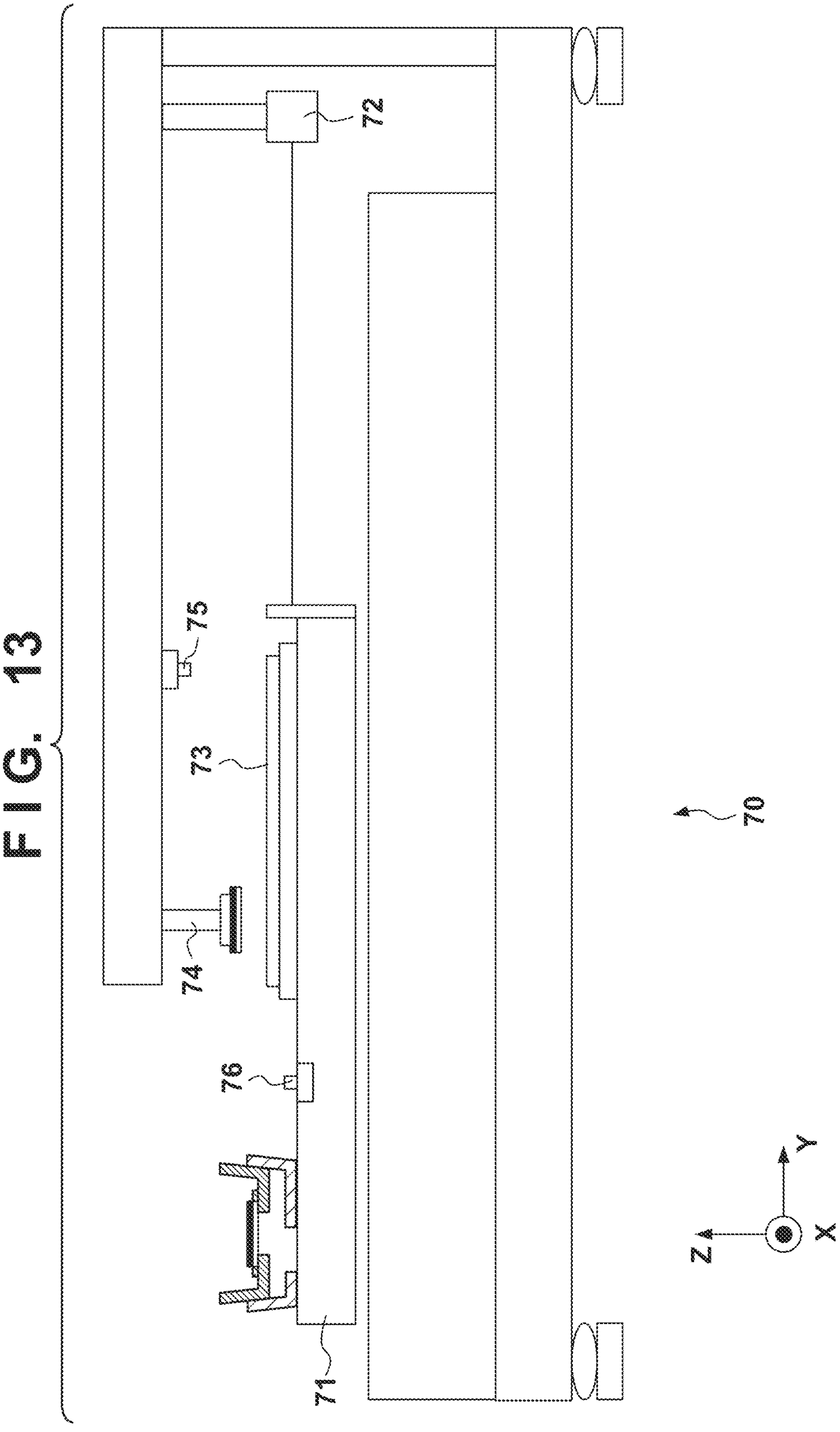
FIG. 13 is a view schematically showing an operation of the bonding apparatus according to the fourth embodiment which extracts a die from the storage container according to the fourth embodiment and bonds the die to a bonding target.

FIGS. 12 and 13 schematically show an operation of a bonding apparatus 70 according to the fourth embodiment which extracts the die 4 from the storage container C and bonds it to a wafer that is a bonding target. The configuration and operation of the bonding apparatus 70 according to the fourth embodiment are the same as the configuration and operation of the bonding apparatus 70 according to the first embodiment except that one die 4 is stored in the storage container C.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-204637, filed Dec. 21, 2022, which is hereby incorporated by reference herein in its entirety.

What is claimed is:

1. A storage container for storing a die, comprising:
a main body including a first through hole and a second through hole;
a first lid that is attachable to the main body to cover the first through hole; and
a second lid that is attachable to the main body to cover the second through hole,
wherein the die is removable from and insertable into the main body via the first through hole, and the die is processable via the second through hole.

2. The container according to claim 1, wherein
a plurality of second through holes including the second through hole are provided in the main body, and
the plurality of second through holes are configured to process a plurality of dies via the plurality of second through holes.

3. The container according to claim 2, wherein
the main body includes a holder configured to hold the plurality of dies.

4. The container according to claim 3, wherein
the holder is provided with a plurality of regulating portions configured to regulate positions of the plurality of dies.

5. The container according to claim 4, wherein
the holder includes a first surface that faces the first lid in a state in which the first lid is attached to the main body, and
each of the plurality of regulating portions is a tapered portion tilted with respect to the first surface.

6. The container according to claim 4, wherein
the holder includes a first surface that faces the first lid in a state in which the first lid is attached to the main body, and
each of the plurality of regulating portions comprises one or a plurality of projections projecting from the first surface.

7. The container according to claim 3, further comprising a pressing portion configured to press the plurality of dies against the holder in a state in which the first lid is attached to the main body.

8. The container according to claim 2, wherein
the plurality of dies are fixed to the first lid by a temporary adhesive layer.

9. The container according to claim 2, wherein
the plurality of dies are fixed to the first lid by vacuum suction.

10. The container according to claim 1, further comprising a first lock mechanism configured to lock the first lid in a state in which the first lid is attached to the main body.

11. The container according to claim 1, further comprising a second lock mechanism configured to lock the second lid in a state in which the second lid is attached to the main body.

12. A processing method comprising:
releasing a second lid of a storage container defined in claim 1;
processing, via a second through hole, a die held by the storage container; and
closing the second lid.

13. The method according to claim 12, wherein the processing includes at least one of a process of activating the surface of the die, a process of washing the surface, and a process of making the surface hydrophilic.

14. A bonding method comprising:

releasing a first lid of a storage container defined in claim 1;

extracting a die held by the storage container from the storage container via a first through hole; and bonding the die extracted from the storage container to a bonding target.

15. A bonding method comprising:

releasing a second lid of a storage container defined in claim 1;

processing, via a second through hole, a die held by the storage container;

closing the second lid;

transferring the storage container to a bonding apparatus;

releasing a first lid of the storage container;

extracting the die held by the storage container from the storage container via a first through hole; and bonding the die extracted from the storage container to a bonding target.

16. The method according to claim 15, wherein the processing includes at least one of a process of activating the surface of the die, a process of washing the surface, and a process of making the surface hydrophilic.

17. A processing apparatus comprising:

an opening/closing mechanism configured to handle a storage container for storing a die, the storage container comprising a main body including a first through hole and a second through hole, a first lid that is attachable to the main body to cover the first through hole, and a second lid that is attachable to the main body to cover the second through hole, wherein the die is removable from and insertable into the main body via the first through hole, and the die is processable via the second through hole, and wherein the opening/closing mechanism is further configured to open/close the second lid of the storage container; and a processor configured to process, via the second through hole, the die held by the main body of the storage container.

18. The apparatus according to claim 17, wherein a process of the die by the processor includes at least one of a process of activating a surface of the die, a process of washing the surface, and a process of making the surface hydrophilic.

19. A bonding apparatus comprising:

an opening/closing mechanism configured to open/close a first lid of a storage container for storing a die, the storage container comprising a main body including a first through hole and a second through hole, a first lid that is attachable to the main body to cover the first through hole, and a second lid that is attachable to the main body to cover the second through hole, wherein the die is removable from and insertable into the main body via the first through hole, and the die is processable via the second through hole; and an operation mechanism configured to extract the die held by the main body of the storage container from the storage container via the first through hole and bond the die to a bonding target.

* * * * *